Aug. 23, 1966 H. WEINSTEIN 3,268,782
HIGH RATE OF RISE OF CURRENT-FOUR-LAYER DEVICE
Filed Feb. 2, 1965
FIG. 1 - PRIOR ART
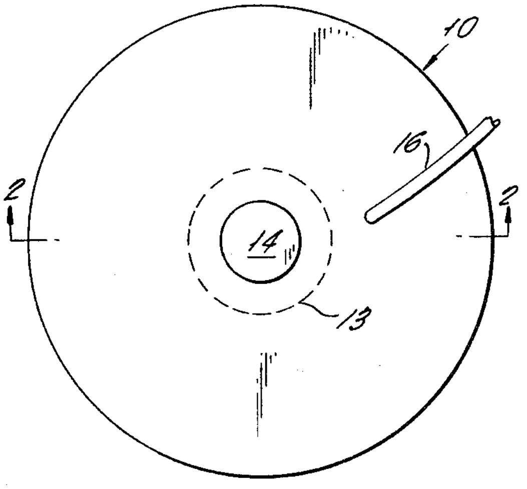
PRIOR ART - FIG. 3
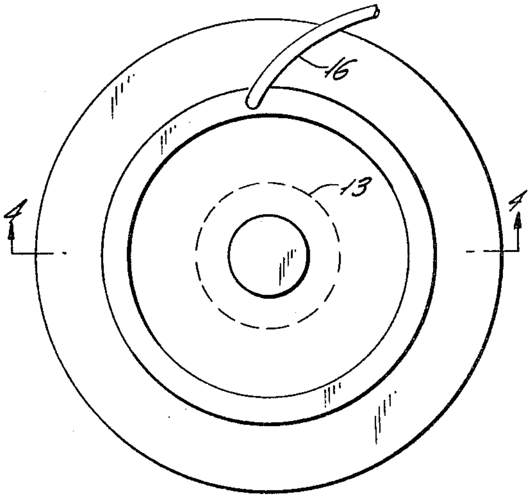
FIG. 2 - PRIOR ART
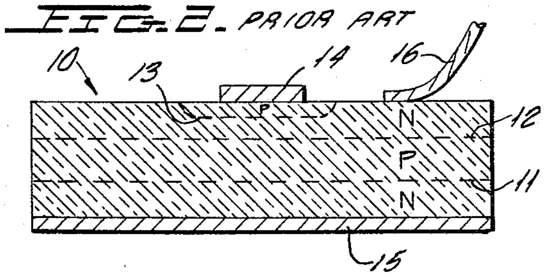
PRIOR ART - FIG. 4
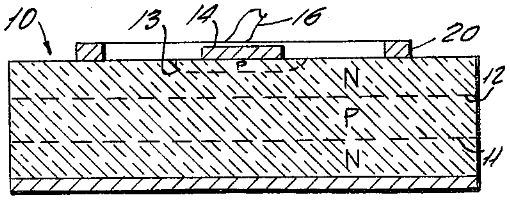
FIG. 6
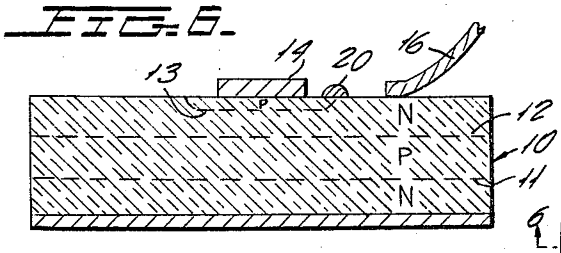
FIG. 5
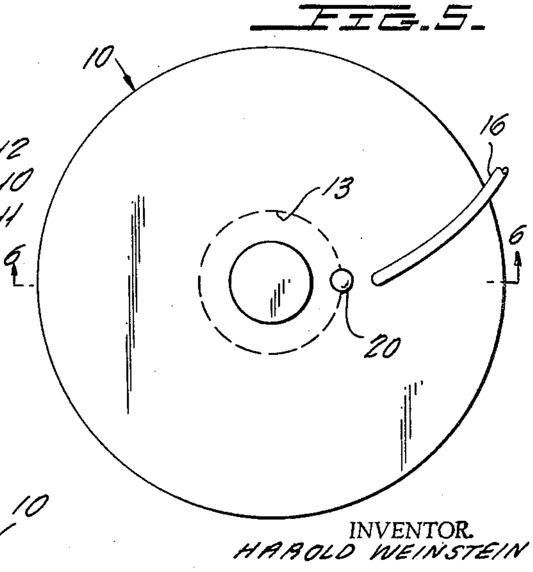
FIG. 7
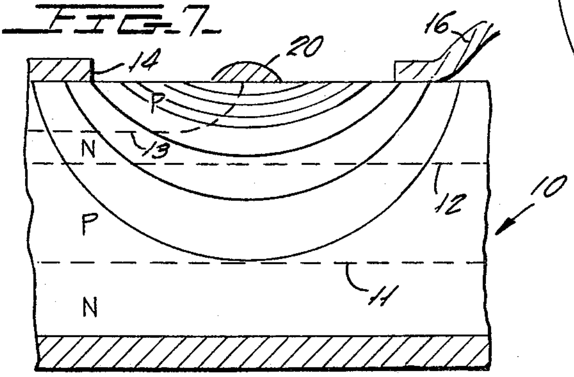
INVENTOR.
HAROLD WEINSTEIN
BY
OSTROLENK, FABER, GERB & SOFFEN
ATTORNEYS United States Patent Office 3,268,782

Patented August 23, 1966

3,268,782

HIGH RATE OF RISE OF CURRENT-FOUR-LAYER DEVICE

Harold Weinstein, Van Nuys, Calif., assignor to International Rectifier Corporation, El Segundo, Calif., a corporation of California Filed Feb. 2, 1965, Ser. No. 429,868
5 Claims. (Cl. 317—235)

This invention relates to four-layer semiconductor devices such as controlled rectifiers, and more particularly relates to the intentional reduction of collection efficiency adjacent the gate region, thereby permitting a more uniform initiation of conduction over the full surface area of the device.

Controlled rectifiers are well known to the art, and are commonly formed of a uniform wafer or chip of semiconductor material such as silicon which has three junctions therein. The upper surface of the wafer commonly contains a cathode electrode connected to a material of one of the conductivity types which is surrounded by material of the other of the conductivity types and a gate electrode which is then commonly connected to this material of the other of the conductivity types. In operation, and with the application of current to the gate electrode, carriers are injected into the upper junction, whereupon a current flow from the anode to the cathode is made possible.

As is described in copending application Serial No. 415,292, filed December 2, 1964, entitled "High Speed Controlled Rectifier," in the names of Edward J. Diebold and Yigal Yanai, and assigned to the assignee of the instant invention, and as commonly known to the art, the initial flow of the main current from anode to cathode will start at the region immediately adjacent the gate, since the injected carriers require a certain discrete time to diffuse through the width of the device. Therefore, the main power current would initially be conducted through an extremely small localized area immediately adjacent the gate, whereupon it is necessary to limit this current until the complete width of the normally blocking junction is placed in a condition to conduct current, since the full load current through the small localized region could damage or destroy the device. This, therefore, limits the maximum rate of rise of power current which can be used with the device.

The principle of the present invention is to provide a novel structure wherein that region of the wafer immediately adjacent the gate electrode has a decreased collector efficiency as compared to the remainder of the junction, whereupon the full width of the junction will become more equally conductive at a given time. That is to say, the time at which the junction portion immediately adjacent the gate becomes capable of conducting large power currents from anode to cathode is intentionally delayed until that time that the remainder of the junction becomes conductive for anode to cathode currents.

In this manner, it is now possible to have an extremely rapid rate of rise of current from anode to cathode since the resistance along the complete length of the blocking junction decreases with a greater degree of simultaneity.

In accordance with the invention, the collector efficiency of the material immediately adjacent the gate can be decreased, as for example, by placing a spot of gold immediately across the cathode to gate junction at this point and diffusing gold into this section. As is well known, the diffused gold will spoil the injection and collection efficiency of this area, and since the gold is diffused inwardly, its spoiling effect along the width of the wafer will decrease moving outwardly from the gate electrode. Thus, the spreading time required for carriers to traverse along the full length of the junction will now be correlated to the anode to cathode conductivity along the junction in such a manner that substantially simultaneous anode to cathode conductivity through the junction is permissible.

Accordingly, a primary object of this invention is to provide a four-layer device having a high rate of rise of anode to cathode current.

Another object of this invention is to reduce the effect of initial power current conduction through only wafer regions immediately adjacent the gate.

These and other objects of this invention will become apparent from the following description when taken in connection with the drawings, in which:

FIGURE 1 is a top plan view of a prior art type of controlled rectifier.

FIGURE 2 is a cross-sectional view of FIGURE 1 taken across the lines 2—2 in FIGURE 1.

FIGURE 3 is a top plan view of a second type of controlled rectifier produced in accordance with the prior art.

FIGURE 4 is a cross-sectional view of FIGURE 3 across the lines 4—4 in FIGURE 3.

FIGURE 5 is a top plan view of a controlled rectifier manufactured in accordance with the present invention.

FIGURE 6 is a cross-sectional view of FIGURE 5 taken across the lines 6—6 in FIGURE 5.

FIGURE 7 is an enlarged fragmental view of FIGURE 6 to better illustrate the placement of the gold diffusing material across the gate to cathode junction adjacent the gate lead.

Referring first to FIGURES 1 and 2, I have illustrated therein a typical prior art controlled rectifier which is comprised of a wafer 10 of a single crystal semiconductor material such as silicon. The wafer 10 then has four layers of alternate conductivity types such as the lower P-type layer separated from an upper N-type layer by the junction 11, shown in dotted lines, and a furher upper P-type layer separated from the lower N-type layer by the junction 12. A central N-type layer is then formed in this latter P-type layer along the gate to cathode junction 13. This latter N-type layer then receives a cathode electrode 14 therein, while the bottom of the wafer receives the anode electrode 15. The upper P-type layer then has a gate lead 16 connected thereto, as shown.

The operation of this type device and the construction thereof is well known to those skilled in the art, and is fully described in the literature. Thus, in operation, a main power circuit will be connected between electrodes 14 and 15. In order to render this circuit conductive, a current signal is applied between the gate 16 and the cathode 14 wherein carriers injected from lead 15 will render the junction 12 conductive. However, a certain length of time is required for the carriers injected from gate 16 to move throughout the width of the wafer, and thus render the junction 12 conductive over its entire closed length. Because of this time lag, the portion of junction 12 closest to gate lead 16 will initially become conductive so that power current from anode 15 to cathode 14 will initially flow through this very small restricted area. Gradually, as the carriers injected from gate lead 16 spread throughout the width of the device, the remaining portions of the junction 12 become conductive to the power currents.

However, since it is necessary to limit the initial current flow through the initially conductive but very small portion of junction 12 (by external circuit means) and to permit the power current to increase only as the remaining portions of junction 12 become conductive, the *di/dt* of the device is limited.

Many arrangements have been proposed in the past to overcome this problem. By way of example, and as shown in FIGURES 3 and 4 wherein components similar to those of FIGURES 1 and 2 bear similar identifying numerals, the gate electrode has taken the form of a ring 20 which surrounds cathode 12 and is equidistant therefrom. Alternatively, multiple ring emitters have been used in the past.

Even with these devices, however, a certain spreading time is required to permit the portions of junction 12 interior of ring 20 to become conductive.

The novel invention is illustrated in FIGURES 5, 6 and 7 wherein the components identical to those of FIGURES 1 through 4 have been given similarly identifying numerals.

It will be seen that the structure of FIGURES 5, 6 and 7 is substantially identical to the standard prior art device of FIGURES 1 and 2 so that standard manufacturing techniques are used substantially throughout its manufacture.

In accordance with the invention, however, and at any desired stage of manufacture of the device, after the formation of the junctions 11, 12 and 13, a small mass of gold 20 is applied across the junction 13 immediately adjacent the gate lead 16. Alternatively, the mass of gold 20 could be ring-shaped and surround the outer boundary of junction 13. This gold is then diffused into the wafer, as indicated by the curved lines in FIGURE 7, in such a manner that gold atoms are heavily concentrated in the area of junction 13 immediately adjacent lead 16, while their concentration decreases outwardly from this junction area. Therefore, the material in the vicinity of gate lead 16 has a decreased injection and collector efficiency so that current conduction therethrough of carriers in the main power circuit extending from anode 15 to cathode 14 will be delayed until all portions of junction 12 have become conductive due to the spread of injected carriers from lead 16.

Therefore, the resistance of junction 12 over its full length will go from an extremely high resistance to an extremely low resistance in a shorter time than in the prior art device. That is to say, in the prior art, the region of junction 12 immediately adjacent gate 16 becomes almost immediately conductive, while the remainder of the junction becomes conductive only after some predetermined time determined by the drift of the carriers injected from lead 16 over the full width of the wafer.

The present invention delays the time at which the junction area adjacent lead 16 becomes conductive, while the remainder of the junction will become conductive within approximately the same time as in the prior art. Therefore, the time range within which the complete junction becomes conductive is decreased, thus permitting a higher *di/dt* for power currents flowing from anode 15 to cathode 14.

In a typical example of the invention, I have selected gold as the means for spoiling the collector efficiency in the region of junction 12 adjacent lead 16. Clearly, however, other materials could be used such as copper.

When gold is selected, and in a typical embodiment of the invention, a gold film deposit having a diameter of 100 mils is applied to the wafer, and the wafer is thereafter inserted into a diffusion furnace for 60 minutes at a temperature of 820°. This will cause a sufficient diffusion of gold into the wafer to decrease the injection collection efficiency where desired, while, however, the remaining portions of the junction are substantially unaffected, since few or no gold atoms will reach these areas.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. A controlled rectifier; said controlled rectifier comprising four adjacent layers of alternately opposite conductivity types defining a first, second and third parallel spaced junctions; said first junction having the edge thereof terminating on one surface of said wafer; a cathode electrode secured to said one surface of said wafer on one side of said edge of said first junction; a gate electrode connected to a discrete localized surface area of said one surface of said wafer on the opposite side of said edge of said junction and a localized mass of gold fused to a localized area of said one surface of said wafer at a position directly interposed between said gate electrode and said cathode electrode; said mass of gold extending across said edge of said first junction.

2. A controlled rectifier; said controlled rectifier comprising four adjacent layers of alternately opposite conductivity types defining a first, second and third parallel spaced junctions; said first junction having the edge thereof terminating on one surface of said wafer; a cathode electrode secured to said one surface of said wafer on one side of said edge of said first junction; a gate electrode connected to a discrete localized surface area of said one surface of said wafer on the opposite side of said edge of said junction and a localized mass of gold fused to a localized area of said one surface of said wafer at a position directly interposed between said gate electrode and said cathode electrode; said mass of gold extending across said edge of said first junction; said edge of said first junction defining a closed line.

3. A controlled rectifier; said controlled rectifier comprising four adjacent layers of alternately opposite conductivity types defining a first, second and third parallel spaced junctions; said first junction having the edge thereof terminating on one surface of said wafer; a cathode electrode secured to said one surface of said wafer on one side of said edge of said first junction; a gate electrode connected to a discrete localized surface area of said one surface of said wafer on the opposite side of said edge of said junction and a localized mass of gold fused to a localized area of said one surface of said wafer at a position directly interposed between said gate electrode and said cathode electrode; said mass of gold extending across said edge of said first junction; said edge of said first junction defining a closed line; the material above said first junction having P-type conductivity; the material below and surrounding said first junction having N-type conductivity.

4. A controlled rectifier; said controlled rectifier comprising four adjacent layers of alternately opposite conductivity types defining a first, second and third parallel spaced junctions; said first junction having the edge thereof terminating on one surface of said wafer; a cathode electrode secured to said one surface of said wafer on one side of said edge of said first junction; a gate electrode connected to a discrete localized surface area of said one surface of said wafer on the opposite side of said edge of said junction; and a localized concentration of atoms of material characterized to reduce carrier collection efficiency interposed between said area of connection of said gate electrode and said cathode electrode and extending across said edge of said first junction; said localized concentration of atoms decreasing in number in any direction extending from the said one surface of said wafer into said wafer.

5. The rectifier substantially as set forth in claim 4 wherein said atoms are gold.

References Cited by the Examiner

UNITED STATES PATENTS

| | | | |
|---|---|---|---|
| 2,962,605 | 11/1960 | Grosvalet | 317—235 |
| 3,176,147 | 3/1965 | Miller | 317—235 |
| 3,226,614 | 12/1965 | Haenichen | 317—235 |

JOHN W. HUCKERT, *Primary Examiner.*

J. D. CRAIG, *Assistant Examiner.*